(12) United States Patent
Choi et al.

(10) Patent No.: US 7,867,054 B2
(45) Date of Patent: Jan. 11, 2011

(54) FLAT PANEL DISPLAY AND METHOD OF FABRICATING THE SAME

(75) Inventors: Dong-Soo Choi, Seoul (KR); Jin-Woo Park, Yongin-si (KR); Seung-Yong Song, Hwaseong-gun (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 0 days.

(21) Appl. No.: 12/473,226

(22) Filed: May 27, 2009

(65) Prior Publication Data

US 2009/0247040 A1   Oct. 1, 2009

Related U.S. Application Data

(62) Division of application No. 11/100,137, filed on Apr. 5, 2005, now Pat. No. 7,554,264.

(30) Foreign Application Priority Data

Apr. 7, 2004   (KR) .................... 10-2004-0023893

(51) Int. Cl.
   *H01J 9/00* (2006.01)
(52) U.S. Cl. .......................... 445/25; 445/44
(58) Field of Classification Search .................. None
   See application file for complete search history.

(56) References Cited

U.S. PATENT DOCUMENTS 5,239,228 A   8/1993   Taniguchi et al.
5,811,177 A   9/1998   Shi et al.
6,049,147 A   4/2000   Sanada et al.
6,413,800 B1  7/2002   Kyle
6,489,719 B1  12/2002  Young et al.
6,633,121 B2 * 10/2003  Eida et al. .................... 313/504

(Continued)

FOREIGN PATENT DOCUMENTS

CN   1389085 A   1/2003

(Continued)

OTHER PUBLICATIONS

Chinese Office action dated Jan. 4, 2008, for corresponding Chinese application 2005100638047, with English translation indicating relevance of reference listed in this IDS.

(Continued)

*Primary Examiner*—Ashok Patel
(74) *Attorney, Agent, or Firm*—Christie, Parker & Hale, LLP

(57) ABSTRACT

A flat panel display and method of fabricating the same are disclosed. The flat panel display includes a first substrate having a pixel region; a light-emitting element located on the pixel region; a second substrate located opposite the first substrate; and a sealant located between the first and second substrates to cover the light-emitting element. At least one of the first and second substrates includes a groove formed around at least a portion of the circumference surrounding the pixel region. When the first and second substrates are pressed together with the sealant between them, the sealant spreads, covering the light-emitting element, and at least partially filling the groove.

4 Claims, 5 Drawing Sheets

U.S. PATENT DOCUMENTS

| | | |
|---|---|---|
| 6,784,612 B2 | 8/2004 | Park et al. |
| 6,963,168 B2 | 11/2005 | Eida et al. |
| 2002/0193035 A1 | 12/2002 | Wei et al. |
| 2003/0062533 A1 | 4/2003 | Yee et al. |
| 2003/0071567 A1 | 4/2003 | Eida et al. |
| 2003/0218422 A1 | 11/2003 | Park et al. |
| 2004/0124771 A1 | 7/2004 | Sundahl et al. |

FOREIGN PATENT DOCUMENTS

| | | |
|---|---|---|
| CN | 1459996 A | 12/2003 |
| CN | 1477908 A | 2/2004 |
| CN | 1485929 A | 3/2004 |
| JP | 7-169567 | 7/1995 |
| JP | 2000-100562 | 4/2000 |
| JP | 2000-133847 | 5/2000 |
| JP | 2000-173766 | 6/2000 |
| JP | 2001-189191 | 7/2001 |
| JP | 2002-8853 | 1/2002 |
| JP | 2002-124374 | 4/2002 |
| JP | 2002-329576 | 11/2002 |
| JP | 2003-257625 | 9/2003 |
| JP | 2003-282255 | 10/2003 |
| JP | 2003-297558 | 10/2003 |
| JP | 2003-317942 | 11/2003 |
| JP | 2003-323975 | 11/2003 |
| JP | 2004-79408 | 3/2004 |
| JP | 2005-135677 | 5/2005 |
| KR | 2003-0000438 | 1/2003 |
| KR | 2003-0044659 | 6/2003 |
| KR | 2003-0090419 | 11/2003 |
| TW | 235016 B | 6/2005 |
| WO | WO 03/065470 A1 | 8/2003 |

OTHER PUBLICATIONS

Office action dated Feb. 16, 2006, and English translation, for corresponding Korean Patent Application No. 10-2004-0023893.

Japanese Office action dated Nov. 11, 2008 for corresponding Japanese application No. 2005-058806.

Korean Patent Gazette (10-0666550), dated Jan. 9, 2007, for corresponding Korean Patent Application No. 10-2004-0023893, listing JP 2000-133847; JP 2002-008853; JP 2003-257625; JP 2003-282255; KR 10-20030000438; and US 2002/0193035 A1.

Korean Office action dated Jun. 21, 2005 corresponding to related U.S. Appl. No. 10/725,600 and listing KR 2003-0044659.

Office action dated Jun. 27, 2005 for related U.S. Appl. No. 10/725,600 and citing US 5,239,228; 6,784,612; 6,049,167; US 2003/0071567; US 2003/0062533; JP 2000-100562; JP 2004-079408; KR 2003-044659; and JP 2000-173766.

Chinese Office action, with English translation, dated Jul. 6, 2007 corresponding to related U.S. Appl. No. 10/725,600 and listing JP 2000-100562; and US 6,413,800.

Chinese Certificate issued Apr. 22, 2009 for Chinese Application No. 200310124062.5 corresponding to related U.S. Appl. No. 10/725,600 and listing CN 1389085 A; CN 1485929 A; US 6,413,800 B1; US 5,239,228 A; and JP 2000-100562 A.

* cited by examiner

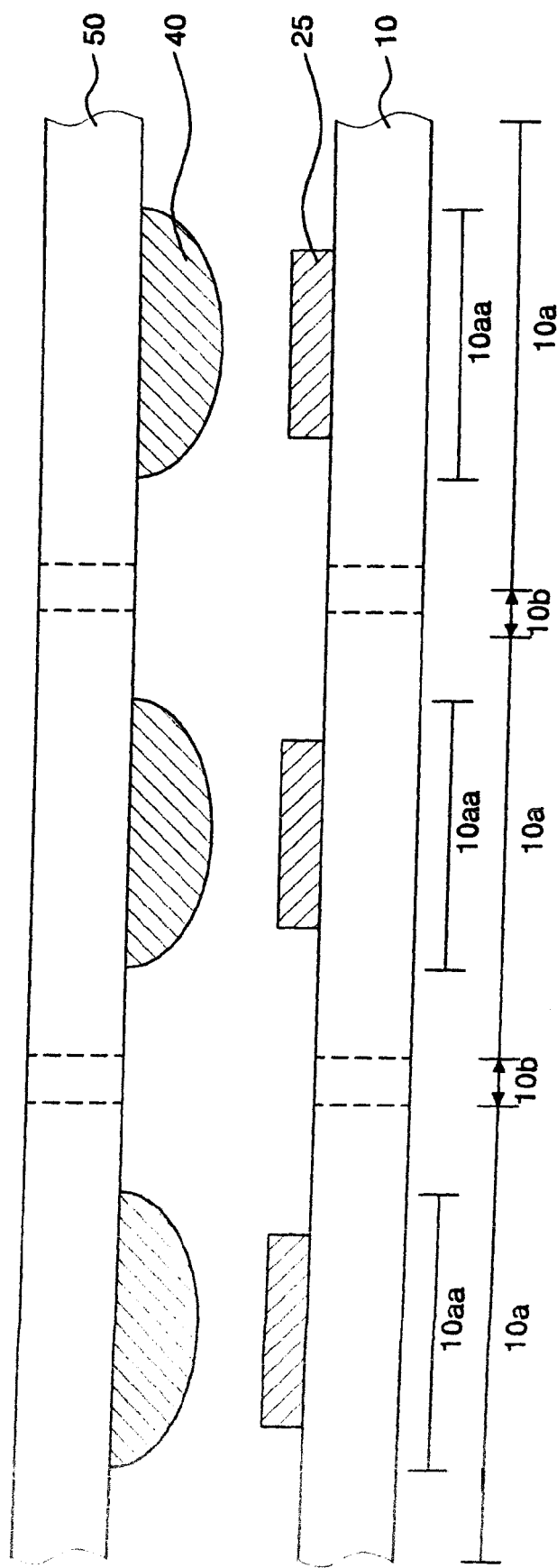

FLAT PANEL DISPLAY AND METHOD OF FABRICATING THE SAME

CROSS-REFERENCE TO RELATED APPLICATION

This application is a divisional of U.S. patent application Ser. No. 11/100,137, filed Apr. 5, 2005, which claims priority to and the benefit of Korean Patent Application No. 2004-23893, filed Apr. 7, 2004, the disclosure of which is incorporated herein by reference in its entirety.

FIELD OF THE INVENTION

The present invention relates to a flat panel display and method of fabricating the same and, more particularly, to a flat panel display and method of fabricating the same including a sealant covering a light-emitting element.

BACKGROUND OF THE INVENTION

An electroluminescence display, being a type of flat panel display, is an emissive display and has advantages of a wide viewing angle, good contrast and fast response speed. For these reasons, electroluminescence displays have attracted attention as the next generation of displays. An electroluminescence display includes a light-emitting element having an anode, a cathode, and an emission layer interposed between the anode and the cathode, and is classified as either an inorganic electroluminescence display or an organic electroluminescence display according to the type of the emission layer.

In the organic electroluminescence display, the light-emitting element is susceptible to being damaged by exterior moisture. Therefore, in order to protect the light-emitting element from exterior moisture, various techniques for encapsulating the light-emitting element using an encapsulating substrate have been developed. One of the encapsulating technologies is a method of applying a sealant on a circumference of a region in which the light-emitting element is formed, and bonding the encapsulating substrate using the sealant as a bonding medium. However, since the sealant has a defined width, it is difficult to fully prevent moisture or oxygen from the exterior environment from penetrating the sealant. In order to improve this, a technique has been developed by which sealant is applied to the entire region in which the light-emitting element is formed.

FIGS. 1a and 1b are cross-sectional views illustrating conventional methods of encapsulating an organic electroluminescence display.

Referring to FIG. 1A, a mother substrate 10 including a plurality of cell regions 10a and scribing lanes 10b defined by the cell regions 10a is provided. Each of the cell regions 10a includes a pixel region 10aa and a pad region (not shown) located in a predetermined region of the periphery of the pixel region 10aa. Then, light-emitting elements 25 are formed in the pixel regions 10aa, respectively.

Meanwhile, an encapsulating substrate 50 is provided, and a sealant 40 is applied on a predetermined region of the encapsulating substrate 50. The region where the sealant 40 is applied corresponds to the pixel region 10aa of the mother substrate 10. Then, the encapsulating substrate 50 is disposed in a way such that the surface of the encapsulating substrate 50 to which the sealant has been applied faces the mother substrate 10.

Referring to FIG. 1B, the encapsulating substrate 50 and the mother substrate 10 are bonded together by applying pressure. At this time, the sealant 40 may be squeezed out up to the circumference of the pixel region 10aa, as defined by the scribing lane 10b and the pad region by the pressure.

Subsequently, the scribing lane 10b is scribed to separate the respective cells 10a, thereby manufacturing the organic electroluminescence display. In the scribing process, the sealant 40 squeezed out to the scribing lane 10b between adjacent cells 10a may cause adjacent cells to attach to each other, thereby causing a separation defect, i.e., a scribing defect between cells 10a adjacent to each other. In addition, an additional process step is required in order to remove the sealant 40 squeezed out to the pad region, i.e., the sealant 40 incorrectly formed on the pad region.

In order to solve the problem, Korean Patent Application No. 2002-28714 discloses "Method of encapsulating OLED and OLED panel using the same." According to the Korean Patent, the method of encapsulating OLED includes forming a partition wall by applying a first sealant to a region of an encapsulating substrate, wherein the region face a region enclosing a selected OLED of a plurality of OLEDs formed on a substrate, filling a second sealant in an opened space formed by the first sealant, bonding the encapsulating substrate and the substrate using the first and second sealants as mediums by applying pressure, and curing the first and second sealants to encapsulate the OLED. However, although the first sealant is formed of a high viscosity material, the method has a problem in that the first sealant may be squeezed out up to an outer periphery by the pressure for bonding the substrate and the encapsulating substrate. Therefore, the aforementioned problems may still occur.

SUMMARY OF THE INVENTION

The present invention provides a method of encapsulating a flat panel display and flat panel display manufactured thereby, which is capable of readily controlling the region in which the sealant is formed.

In an exemplary embodiment of the present invention, a flat panel display includes: a first substrate having a pixel region; a light-emitting element located on the pixel region; a second substrate opposite to the first substrate; and a sealant located between the first and second substrates to cover the light-emitting element. At least one substrate of the first and second substrates is provided with a groove formed along a circumference of the sealant for containing excess sealant.

The second substrate may be a glass substrate or a plastic substrate.

The groove may be formed along an entire circumference of the sealant. In one embodiment of the invention, the groove has a depth of between about 20 and about 500 μm. In another embodiment of the invention, the groove has a width of between about 0.1 and about 5 mm.

The light-emitting element may include a first electrode, an emission layer and a second electrode, which are sequentially stacked on the substrate. The second electrode may be a transparent electrode. In addition, the sealant may be a transparent sealant. Furthermore, the sealant may be a thermosetting sealant or a UV light curing sealant.

In one embodiment of the invention, the flat panel display also includes an optional moisture-absorbing layer located between the sealant and the second substrate. The moisture-absorbing layer may be a layer formed using an alkaline earth metal oxide.

In another exemplary embodiment according to the present invention, a method of fabricating a flat panel display includes: providing a first substrate and a second substrate each having a pixel region; forming a light-emitting element on the pixel region of the first substrate; forming a first groove surrounding the pixel region of the first substrate and/or a second groove surrounding the pixel region of the second substrate; applying a sealant in a region defined by the groove of the second substrate; disposing the second substrate to direct the applied sealant toward the first substrate; and bonding the first and second substrates together by applying pressure.

Forming the groove may be performed using methods such as etching, sandblasting or molding.

In one embodiment, the method further includes, after bonding the first and second substrates, irradiating heat or UV light to the sealant through the first and/or second substrates in order to cure the sealant. Furthermore, the method may further include, after forming the light-emitting element, forming a passivation layer covering the light-emitting element on the first substrate. Meanwhile, the method may further include, before applying the sealant on the second substrate, forming a moisture-absorbing layer on the second substrate.

BRIEF DESCRIPTION OF THE DRAWINGS

The above and other features of the present invention will be described in reference to certain exemplary embodiments thereof with reference to the attached drawings in which:

FIGS. 1A and 1B are cross-sectional views illustrating a conventional method of encapsulating an organic electroluminescence display.

DETAILED DESCRIPTION

Figure 1B:
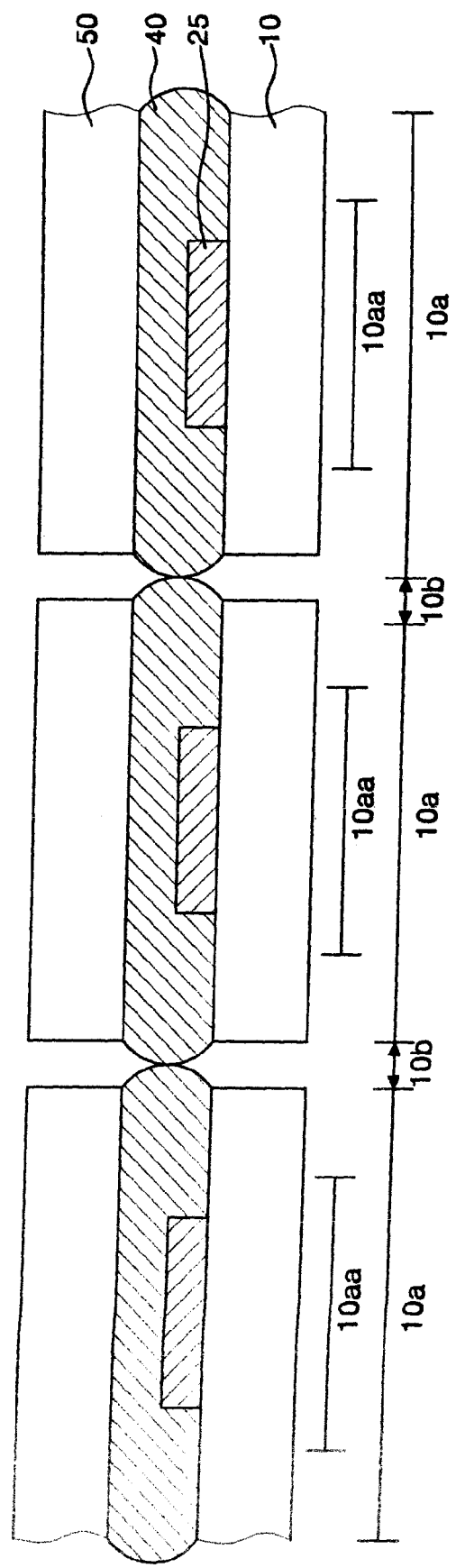

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2A:
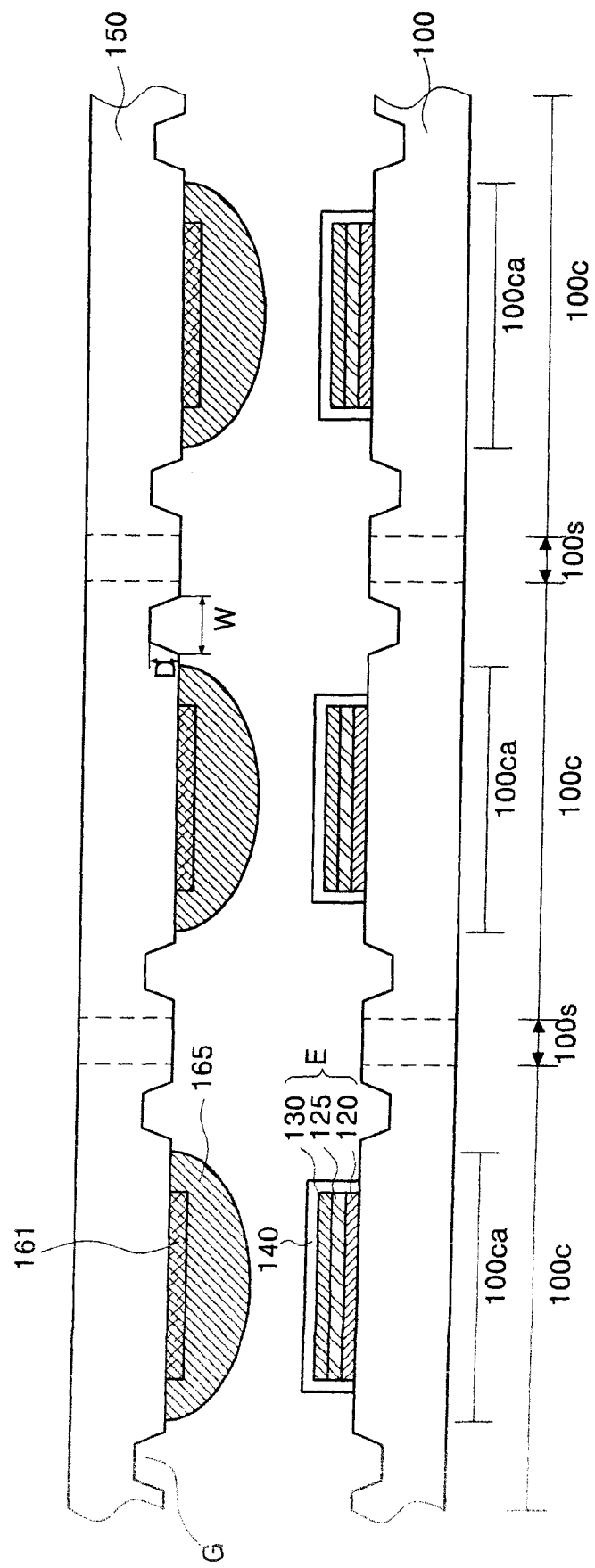
FIGS. 2A to 2C are cross-sectional views illustrating a method of fabricating a flat panel display in accordance with an embodiment of the present invention.
Figure 2B:
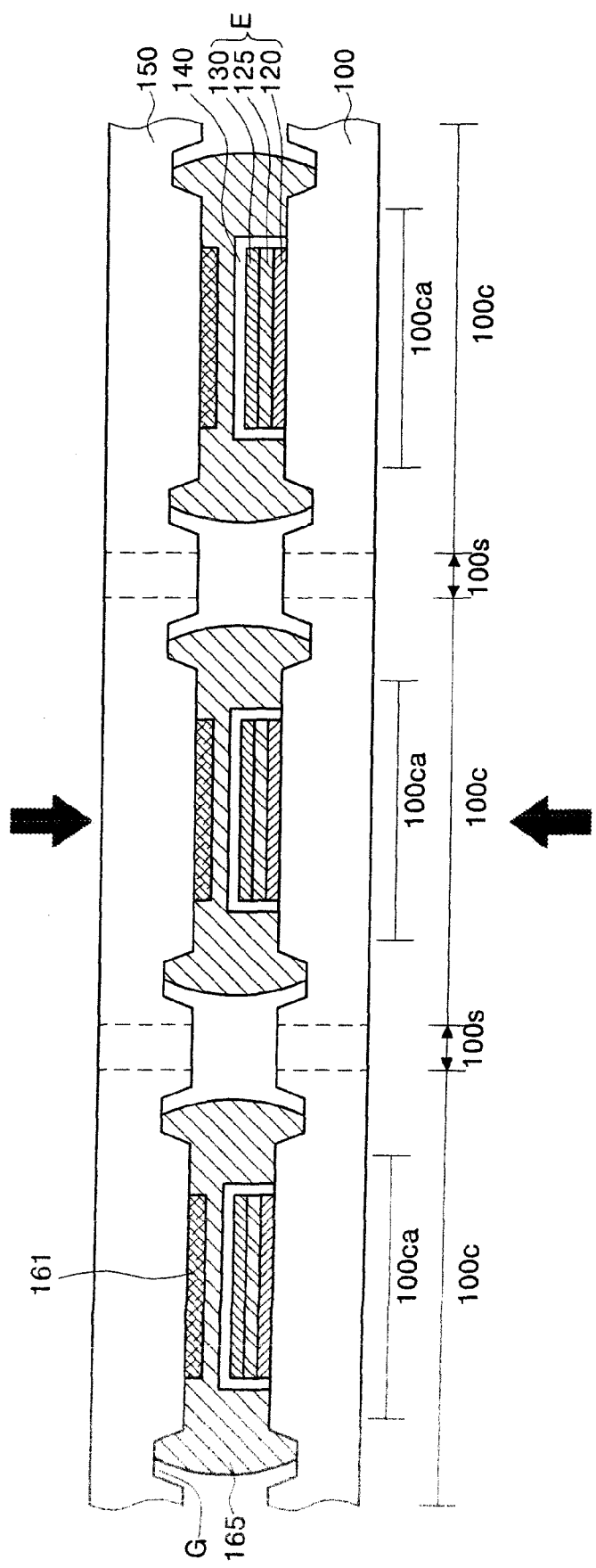
Figure 2C:
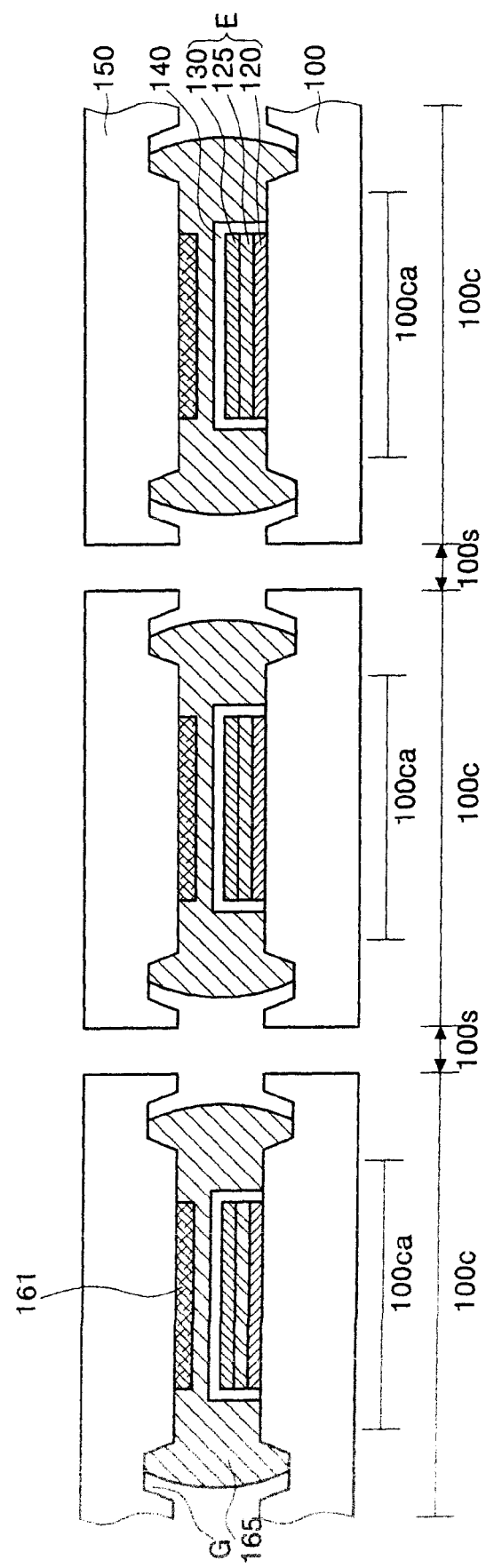

FIGS. 2A to 2C are cross-sectional views illustrating a method of fabricating a flat panel display in accordance with an embodiment of the present invention.

Referring to FIG. 2A, a first substrate 100 having cell regions 100c and scribing lanes 100s located between the cell regions 100c is provided. Each of the cell regions 100c includes a pixel region 100ca and a pad region (not shown) located at a periphery of the pixel region 100ca. The first substrate 100 may be a glass, quartz or plastic substrate.

At least one light-emitting element E is made on the respective pixel regions 100ca. The light-emitting element E is made by forming a first electrode 120 on the first substrate 100, forming an emission layer 125 on the first electrode 120, and then forming a second electrode 130 on the emission layer 125. The emission layer 125 is preferably formed of an organic light-emitting material. In this case, before forming the emission layer 125, a first charge injection layer and/or a first charge transport layer may be formed on the first electrode 120. Furthermore, before forming the second electrode 130, a second charge injection layer and/or a second charge transport layer may be formed on the emission layer 125. Either or both of the first and second electrodes 120 and 130 may be formed of a transparent electrode. Optionally, one of the first and second electrodes is formed of a reflective electrode.

Preferably, a passivation layer 140 covering the light-emitting element E is formed on the light-emitting element E. The passivation layer 140 may protect the light-emitting element E from physical or chemical stimulation of the exterior, and may be formed of an organic layer, an inorganic layer, or a composite layer thereof.

While forming the first electrode 120 and/or the second electrode 130, a pad electrode is formed on the pad region. The pad electrode is a terminal to be electrically connected to FPC (Flexible Printed Circuit film), COG (Chip On Glass) or COF (Chip On Film).

Subsequently, a second substrate 150 is provided. The second substrate 150 may be a glass or plastic substrate. Grooves G are formed on predetermined regions of the first and second substrates 100, 150. It should be noted that while grooves G are shown on both the first and second substrates 100, 150, in other embodiments, a groove G may be formed on just a predetermined region of the first substrate 100, or on just a predetermined region of the second substrate 150. When the groove G is formed on the first substrate 100, the groove G is formed in a region surrounding the pixel region 100ca. Similarly, when the groove G is formed on the second substrate 150, the groove G is formed on a region corresponding to the region surrounding the pixel region 100ca. Preferably, the groove G is formed to fully surround the pixel region 100ca. The groove G may be formed using an etching, sandblasting, or molding method, but its formation is not limited to such methods. Furthermore, in one embodiment, the groove G is preferably formed to have a depth D between about 20 and about 500 μm. In another embodiment, the groove G is preferably formed to have a width W between about 0.1 and about 5 mm.

A sealant 165 is applied to a region of the second substrate that corresponds to the pixel region 100ca of the first substrate 100. For this embodiment, the region is also defined by the groove G of the second substrate 150. Examples of suitable sealants 165 include thermosetting or UV light curing types of sealants. In one embodiment, the sealant 165 is a transparent sealant. Therefore, light emitted from the light-emitting element may be emitted to the exterior through the second substrate 150. That is, a top emission flat panel display may be implemented. However, not limited thereto, it is also possible to implement a bottom emission type emitting light through the first substrate 100 or a double sided emission type emitting light through both the first and second substrates 100 and 150.

Before applying the sealant 165 on the second substrate 150, in one embodiment, a moisture-absorbing layer 161 may be formed on the second substrate 150. In yet another embodiment, the sealant 165 may contain a moisture-absorbing material. According to this embodiment, the moisture-absorbing material may be contained in the sealant 165 in a distributed manner, and the sealant 165 may function as a binder for the moisture-absorbing material.

Examples of suitable materials for the moisture-absorbing layer 161 include alkaline earth metal oxides. Examples of alkaline earth metal oxides include calcium oxide and barium oxide.

Referring to FIG. 2B, the second substrate 150, on which the sealant 165 is applied, is disposed to direct the applied sealant 165 toward the first substrate 100 when the first and second substrates 100 and 150 are pressed together, thereby bonding the first and second substrates 100 and 150 using the sealant 165 as a medium. At this time, the light-emitting element E of the pixel region 100ca is buried into the sealant 165. That is, the sealant 165 covers the light-emitting element E. At the same time, the sealant 165 is squeezed out of the pixel region 100ca by the pressure. However, the squeezed sealant 165 meets the groove G to stop its outward movement as the excess sealant fills the groove G. Therefore, it is possible to prevent the sealant 165 from extending past the scribing lane 100s or the pad region. In other words, the flow of the sealant 165 may be readily controlled by the groove G. Therefore, the need for removing sealant incorrectly formed on the pad region may be omitted, and it is possible to prevent scribing defects from occurring due to the sealant incorrectly forming on the scribing lane 100s.

According to one embodiment, the groove G is located along at least a portion of a circumference of the sealant 165. Preferably, the groove G is located along the entire circumference of the sealant 165. Forming the groove G along the entire circumference of the sealant 165 may be implemented by forming the groove G to entirely surround the pixel region 100ca.

In one embodiment, the pressing of the second and first substrates 150 and 100 is performed in vacuum or inert gas atmosphere. This helps to prevent oxygen or moisture from penetrating into the light-emitting element E.

Subsequently, the sealant 165 may be cured such as by irradiating heat or UV light to the first and second substrates 100 and 150.

Referring to FIG. 2C, the cells are separated by applying physical force to the scribing lanes 100s of the first and second substrates 100 and 150. Each of the separated cells is defined as one flat panel display.

As can be seen from the foregoing, in a method of fabricating a flat panel display, the flow of sealant during the sealing process is readily controlled using one or more grooves formed on a predetermined region or regions of one or both of the first and second substrates to contain excess sealant.

Although the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. A method of fabricating a flat panel display, comprising:
providing a first substrate having a pixel region that defines a pixel region circumference;
forming a light-emitting element on the pixel region of the first substrate;
providing a second substrate;
forming a groove on at least a portion of at least one of the first and second substrates, the groove corresponding to the pixel region circumference of the first substrate;
forming a moisture-absorbing layer on the second substrate;
applying a sealant to one of the first and second substrates corresponding to the pixel region circumference;
pressing the first and second substrates together to thereby spread the sealant between the first and second substrates and outwardly toward the groove.

2. The method according to claim 1, wherein forming the groove is performed by a method selected from etching, sandblasting and molding.

3. The method according to claim 1 further comprising curing the sealant with heat or UV light applied through at least one of the first and second substrates.

4. The method according to claim 1, further comprising forming a passivation layer covering the light-emitting element on the first substrate.

* * * * *